(12) United States Patent
Chapman

(10) Patent No.: US 10,476,427 B2
(45) Date of Patent: Nov. 12, 2019

(54) PHOTOVOLTAIC MODULES

(71) Applicant: SunPower Corporation, San Jose, CA (US)

(72) Inventor: Patrick L Chapman, Austin, TX (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 15/586,100

(22) Filed: May 3, 2017

(65) Prior Publication Data
US 2018/0323743 A1  Nov. 8, 2018

(51) Int. Cl.
| | | |
|---|---|---|
| *H02S 30/10* | (2014.01) |
| *H02S 40/36* | (2014.01) |
| *H02S 30/20* | (2014.01) |
| *F24S 25/67* | (2018.01) |
| *H02J 3/38* | (2006.01) |
| *F24S 20/00* | (2018.01) |
| *H02S 40/38* | (2014.01) |

(52) U.S. Cl.
CPC .............. *H02S 30/10* (2014.12); *F24S 25/67* (2018.05); *H02J 3/383* (2013.01); *H02S 30/20* (2014.12); *H02S 40/36* (2014.12); *H02S 40/38* (2014.12); *F24S 2020/12* (2018.05)

(58) Field of Classification Search
CPC ........... H02S 30/10; H02S 40/36; H02S 40/38
USPC ........................................................ 136/251
See application file for complete search history.

(56) References Cited

U.S. PATENT DOCUMENTS

| | | | | |
|---|---|---|---|---|
| 7,093,593 | B2 * | 8/2006 | Rosene | F24S 10/17 126/565 |
| 7,663,342 | B2 | 2/2010 | Kimball et al. | |
| 8,350,411 | B2 | 1/2013 | Kimball et al. | |
| 2009/0293932 | A1 * | 12/2009 | Augenbraun | H01L 31/02008 136/244 |
| 2012/0152300 | A1 * | 6/2012 | Zuckerman | H01L 31/02021 136/244 |
| 2012/0305051 | A1 * | 12/2012 | Kokotov | B63B 21/50 136/246 |
| 2014/0251416 | A1 * | 9/2014 | Lee | H02S 30/10 136/251 |

(Continued)

FOREIGN PATENT DOCUMENTS

JP  55117290  *  9/1980

*Primary Examiner* — Jayne L Mershon
(74) *Attorney, Agent, or Firm* — Grasso PLLC

(57) ABSTRACT

A modular photovoltaic (PV) system can include a PV cell, a frame coupled to the PV cell, and a converter. The frame is configured to support a plurality of pairs of externally accessible connectors, each pair having a positive voltage connector and a negative voltage connector, the positive voltage connector of each pair of the plurality electrically connected to each other and the negative voltage connector of each pair of the plurality electrically connected to each other. The converter is configured to receive voltage from the PV cell and change the voltage for output at one or more pairs of the externally accessible connectors. The converter may include Maximum Power Point Tracking services to manage the power output from the PV cell. Multiple PV systems may be connected to each other in coplanar and non-coplanar relationships. In some embodiments, the frames have triangular, rectangular, or other polygonal shapes.

19 Claims, 5 Drawing Sheets

(56) References Cited

U.S. PATENT DOCUMENTS

| | | | |
|---|---|---|---|
| 2014/0305493 A1* | 10/2014 | Dhir | H01L 31/02013 |
| | | | 136/251 |
| 2016/0254775 A1* | 9/2016 | Dalland | H02S 30/10 |
| | | | 136/251 |
| 2017/0085213 A1* | 3/2017 | Petrin | H02S 40/36 |

* cited by examiner

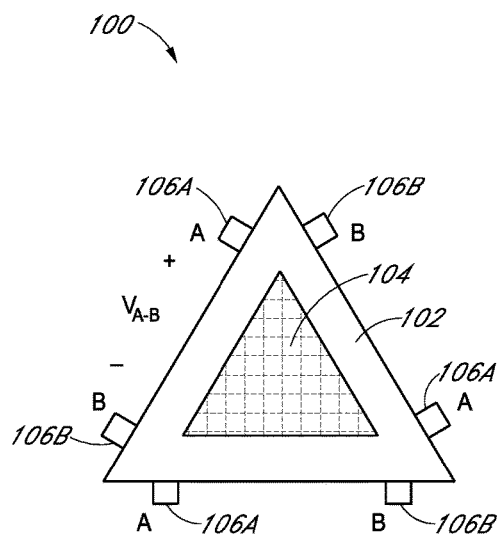
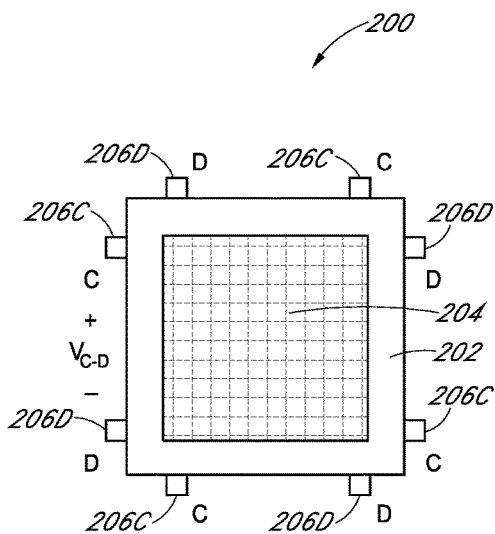
FIG. 1  FIG. 2
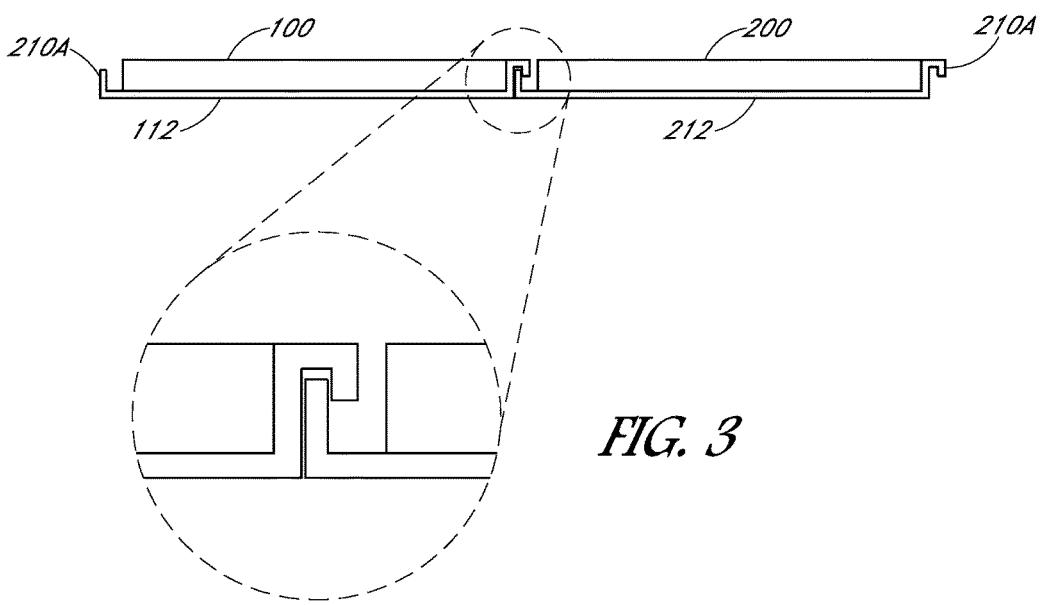
FIG. 3

PHOTOVOLTAIC MODULES

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV device, the electrical energy collected from all of the PV cells can be combined in series and parallel arrangements to provide power with a certain voltage and current. The arrays may then be incorporated into energy products for end users.

BRIEF DESCRIPTION OF THE DRAWINGS

FIG. 1 illustrates an exemplary photovoltaic (PV) module according to some embodiments.

FIG. 2 illustrates an exemplary PV module according to some embodiments.

FIG. 3 illustrates an example of two PV modules connected in a coplanar configuration, according to some embodiments.

DETAILED DESCRIPTION

Figure 4:
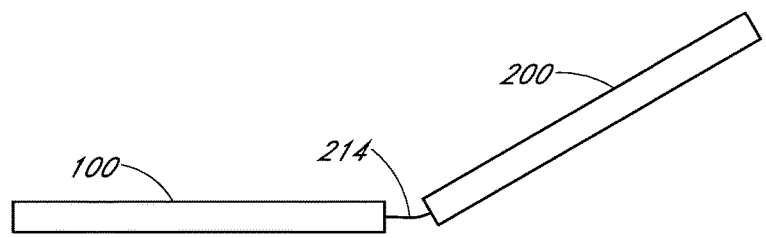
FIG. 4 illustrates an example of two PV modules connected in a non-coplanar configuration, according to some embodiments.

PV devices can be used in one-dimensional arrays, where PV devices are connected one after another into a string. PV devices can also be used in two-dimensional arrays, where several adjacent strings are connected side-by-side. The two-dimensional arrays may be more prevalent in larger installations, such as rooftops and industrial solar power plant systems, while one-dimensional arrays may be more prevalent in smaller installations, such as personal powered devices, e.g., solar powered fans, landscape lighting, and personal charging stations. Manufacture of these one-dimensional and two-dimensional arrays is cumbersome and inefficient as specific dimensions and operating characteristics are considered and tailored for each specific installation ahead of the final design, manufacture, and assembly. This one-off design, manufacture, and assembly process drives costs upwards and serves to limit adaptability and deployment of solar arrays into a broad spectrum of commercial, industrial, and personal applications.

The detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one component/element/node/feature is directly or indirectly joined to (or directly or indirectly communicates with) another component/element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

This specification includes a description of exemplary photovoltaic (PV) modules, which may comprise one or more PV cells supported by a frame and, possibly, a DC voltage conversion circuit of some kind. This PV cell, frame and possible conversion circuit, as well as processes of manufacture, and processes of assembly involving them, are described herein in various combinations and with various features. These combinations and features are illustrative and may be combined with other features and processes. Thus, the descriptions provided are exemplary and not intended to limit the full aspects of the invention and how it may be embodied, to those embodiments specifically illustrated and described herein.

Embodiments may provide a modular PV building block system where PV modules may be physically and electrically coupled in various configurations. The configurations can be suitable for various applications and may provide various outputs and management topologies. Configurations of PV modules may be permanent and may also be reconfigurable, such that connected PV modules may be reconnected in the same orientation or a different orientation after being initially connected. A PV module of these building-block type systems may include one or more PV cells as well as a supporting frame. These cells and frames may be assembled in various configurations to meet space requirements of a target installation as well as voltage or other electrical output requirements of a target installation. For example, 0.6 VDC and 1.2 VDC and 3.0 VDC modules may be combined in various ways to meet a 6.0 VDC output target.

The modules may also include a voltage management circuit as well. These voltage management circuits may provide converter and/or inverter services and functionality for a PV module as well as a grouping of connected PV modules. When a converter circuit is employed in embodiments, the circuit may serve to change output voltage of one or more PV cells of a PV module for subsequent use. Similarly, the converter circuit may also service several PV modules, more like a central converter or inverter.

As noted above, various overall combinations may be assembled using the modular frame and PV cell building block system described herein. For example, a first rectangular frame supporting eight PV cells, i.e., a first module, may be coupled to a second rectangular frame, which also supports eight PV cells, i.e., a second module. Because of the dimensions of the frames, the overall system of sixteen PV cells may have a square configuration if long dimensions of the rectangular frames are adjacent. Conversely, if the short ends of the frames are coupled, the overall resulting system remains a rectangle and will be twice as long as either frame before the frames were coupled. Under this modular system, numerous numbers of system shapes and sizes can be made from assembling modules of PV cells and frames together.

The PV modules of embodiments may have various shapes, including rectangular, square, circular, triangular, oval, and numerous polygons. This building block scheme for PV modules can enable PV modules to be coupled together to accommodate power demands of a final application, physical shape and/or size requirements of a final application, and for other reasons as well. For example, if a 7.2 VDC 24 Watt output is required to power a hand-held fan, twelve 0.6 VDC modules may be connected together and attached to a converter circuit for managing electrical output to the fan. Similarly, 1.2 VDC modules may be connected to 0.6 VDC modules as well to reach the 7.2 VDC target. Other connections and groupings may also be conducted, where target voltages are achieved through other module groupings as well as with or solely using downstream conversion circuits. Still further, the combination of cells and converters can be variously configured, using PV modules of different shapes, sizes, outputs, and configurations, to address voltage, power, cost, size, and other metrics and provide an optimum solution. For example, space may be optimized by using oval PV modules in near oval applications and power can be optimized by combining PV modules with different power characteristics to fit a certain target location.

PV Module connection may occur during assembly of a fan, by a manufacturer of the fan who did not special order PV cells for the specific fan application, but had many various PV modules in stock and ready for use in different products. This manufacturer may select from its stock of PV modules in order to finish assembly or manufacture of its fan product through the use of stock PV modules that were not, necessarily specially designed for use in the fan application. Thus, embodiments, can provide flexibility for manufacturers or others to tailor PV module combinations to specific applications for which a specific PV module or modules were not specifically designed for or when stand-alone specific PV cells were not thought to be readily in stock.

As noted, this flexibility of design can include flexibility in electrical output as well as size and shape. PV module kits can be provided where numerous different sizes and shapes and outputs of PF modules are provided and a user may then select the combination of sizes, shapes, and outputs to suit his or her needs. This ability to assemble, through the connection and switch features described herein, may allow embodiments to be employed in a first application and then redeployed in a second application after the first use was no longer preferred. For example, an assembly of six PV modules, including six frames and PV cells within those frames and one DC converter may be employed to power outdoor patio lights for several years. Then, when the homeowner moves or wishes to use the PV modules for a different purpose, the modular system may be deconstructed and assembled in a different combination for a different use. This modularity in assembly and ability to deconstruct and reuse may provide flexibility and prolong the usefulness of each frame and PV cell(s).

Still further, the modularity of embodiments may provide for placement of PV cells in unusual locations or in unusual shapes. For example, if a semi-circle cap of a hat is a target location for PV power, to provide electrical power for lights or a fan, the modularity of several triangular shaped PV modules may be employed to encircle the rim of a cap and provide power to the intended load. This flexibility of shape may apply in larger designs as well. For example, solar-powered vehicles, having aerodynamic shapes, may employ combinations of polygons, circles, and ellipses to cover the vehicle. Various other applications where both shape and power output specialization need be employed in short turn-around times or with minimal specialized design, can benefit from and employ PV modules in accord with embodiments.

In some embodiments, the connectors between each PV module may be biased to prevent detachment and/or to promote proper connection. When the connectors are biased against detachment, a deconnector pin or other arrangement may be used to retard unwanted disconnection of the connectors. In other words, a connector may have a male pin and a female receiver that accepts the pin and allows the pin to snap into the receiver when the connector is properly seated. To disconnect the connectors the pin may need to be pushed out of the female receiver before the connectors can be slid apart. Proper connection may be provided through orientation tabs to prevent connection of positive and negative connectors or other unwanted connections. These orientation tabs may use friction, specific shape, and other features to promote proper connections and render improper connections impossible.

As noted, PV modules of embodiments may contain a supporting frame and one or more PV cells. This combination may have the frame surrounding the cells and defining the perimeter of the module. The frame may also be at other locations relative to the cell(s). For example, the frame may be on two perimeters of a rectangular PV module and below two of the other perimeters of the rectangle. Similarly, if the PV module is in the shape of a circle, the frame may be along the circumference of the circle or may be within the circle as well. Moreover, the frame does not need to mimic the shape of the module. For example, a rectangular frame or a frame in the shape of an X can be supporting PV cells having a circular perimeter.

In embodiments, connectors are preferably accessible and uniformly spaced on each perimeter side of the PV module. Also, the connectors preferably extend out from the PV module such that two PV modules can be connected side-by-side with little or no space between them. However, as shown in FIG. 4, a space may exist between PV modules when the modules are connected.

PV modules of embodiments may include inverters or converters or other power management circuits to change the output of the individual PV modules or a group of modules. Inverters and converters, as well as other power management circuits, may also be employed to serve a grouping of modules rather than only on a one-on-one basis, e.g., one converter for one PV module.

Individual PV modules and combinations of them may be encapsulated for environmental protection. This encapsulation may surround each PV module as well as groupings of PV modules. The encapsulation may serve to protect the PV cell(s), frame, and any power management circuitry from environmental impacts or other external forces. Encapsulation may also be performed after assembly and connections have been made to protect the connections, hold the PV modules in place, encapsulate unused connectors, and for other reasons as well. For example, two PV modules connected by traces and positioned in a non-planar fashion may be connected, then secured in place with epoxy, and then encapsulated in a potting material with only the PV cell(s) exposed in their final installation position. A manufacturer may conduct these encapsulation steps or others when incorporating PV modules of embodiments into a product or other item of manufacture.

As noted above, the modular flexibility may allow for converters or PV cells with different outputs to be connected together to reach a target power output. For example, if a 4.5 Volt AC output is desired a 1.5 Volt DC and a 3.0 Volt DC PV module may be connected where either or both of the PV modules also contains a converter circuit for outputting the AC voltage. This converter circuit may have various degrees of complexity with some being uncomplicated two transistor inversion circuits while others may have more functionality and features, such as an H-bridge and Maximum Power Point Tracking. The converter circuit may also have boost capabilities in embodiments. Thus, modular systems of embodiments may include various shaped PV modules with different output specifications and one or more power management circuits for each module and/or for the connected grouping of modules. Once this grouping is connected and secured in its final application, the modules and any circuitry may be further covered in epoxy or silicon or other suitable material for final use.

FIG. 1 depicts a PV module 100 that may be used in PV modular systems according to some embodiments. The PV module 100 comprises a triangular frame 102 surrounding a plurality of solar cells 104. Each side of the frame 102 supports a pair of externally accessible connectors, a positive voltage connector 106A and a negative voltage connector 106B. Internally, the positive voltage connectors 106A are electrically connected to each other and the negative voltage connectors 106B are electrically connected to each other. When light is reaching the solar cells 104 a voltage $V_{A-B}$ is present across the connectors 106A, 106B. Although referred here as a plurality of solar cells 104, in some embodiments, the plurality of solar cells 104 can be one solar cell.

FIG. 2 depicts a PV module 200 that may be used in modular PV systems according to some embodiments. The PV module 200 comprises a square frame 202 surrounding a plurality of solar cells 204. Each side of the frame 202 supports a pair of externally accessible connectors, a positive voltage connector 206C and a negative voltage connector 206D. The positive voltage connectors 206C may be electrically coupled to each other and the negative voltage connectors 206D may be electrically coupled to each other. As shown in subsequent figures, the connections of connectors C and D may be severed such that only one side or two sides or three sides can provide a voltage while the other nonconnected and now severed side can no longer provide a voltage. When light is reaching the solar cells 204 a voltage $V_{C-D}$ is present across the connectors 206C, 206D. Although referred here as a plurality of solar cells 204, in some embodiments, the plurality of solar cells 204 can be one solar cell.

The triangle and square frames 102, 202 of the embodiments illustrated in FIGS. 1 and 2 are just two of the possible shapes in which PV systems of the present invention may be formed and are representative of polygonal frames in general that may be incorporated into PV systems, according to embodiments. The illustrated and described PV systems 100, 200 are likewise representative, regardless of shape or internal or external electrical configuration. In an example, the frames 102, 202 can be circular, rectangular, trapezoidal, or any other polygonal frame shape.

In addition to providing electrical connections to the solar cells of the PV modules, the positive and negative connectors may also provide mechanical connections to other PV modules to form a PV array or device. To facilitate building block type connection layouts, the distance between the positive and negative connectors of each pair of connectors on each side is preferably uniform or the same. For example, the distance between the positive and negative connectors 106A, 106B of each of the three pairs of connectors of the PV module 100 is the same as the distance between the positive and negative connectors 206C, 206D of each of the four pairs of connectors of the PV module 200. Thus, two (or more) PV modules may be electrically and mechanically coupled in various ways and between various sides. If a frame or PV cell topology is circular or oval or otherwise lacks a straight side, the connectors may nevertheless be positioned by arms or extenders from the frame to the proper uniform location for connection to another module. In so doing, circular, oval and other nonlinear PV modules may be, nevertheless, coupled to a linear side of a PV module or even a PV module without any linear sides as well.

FIG. 3 illustrates two PV modules 100 and 200 that are mechanically and electrically coupled in the same plane. Each of the connectors 106A, 106B on one side of the frame 102 comprises a first side 210A of a hook or snap and each of the connectors 206C, 206D on one side of the frame 202 comprises a second side 210B of the hook or snap. The first and second sides 210A, 210B of the hook or snap are interlocking or otherwise matable with each other, as illustrated in the enlarged portion of FIG. 3, providing a preferably secure physical connection between the two PV modules 100, 200. Other means may be provided to mechanically and electrically couple the connectors of adjacent PV systems. However, a system, such as the hook or snap system illustrated in FIG. 3, provides a quick, tool-free method of assembling multiple PV cells into an array. And, if desired, the array may be disassembled by reversing the assembly process. A rigid backing 112, 212 may enhance the structural integrity of each PV system 100, 200. Moreover, the rigid backing 112, 212 may provide support for and protection to an overlying array of PV cells.

PV modules 100, 200 may also be coupled in a non-coplanar configuration, as illustrated in FIG. 4. Instead of rigid connectors such as the hook/snap 210A, 210B of FIG. 3, PV modules may be coupled using flexible or hinge-like connectors 214. Such a configuration is beneficial when an array of PV modules is mounted on or integrated into such items as clothing or backpacks, for example, allowing the array to flex with motion of the underlying item. The flexible connectors may be electrically conductive hinges or may be formed from electrical traces or bare conductors having sufficient strength to withstand repeated bending without breaking.

Figure 5:
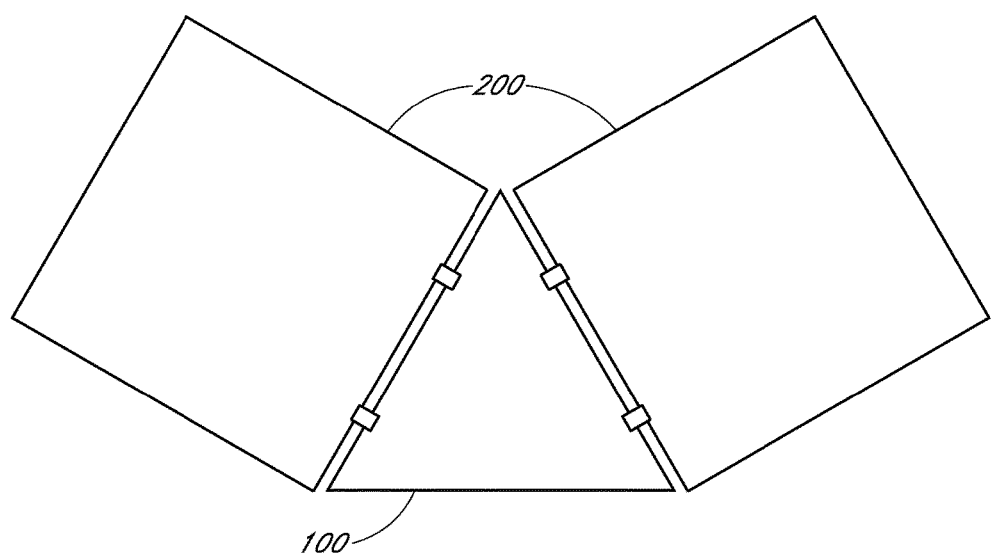
FIG. 5 illustrates an example of the PV module of FIG. 1 coupled to two PV modules of FIG. 2, according to some embodiments.

Due to the many applications for solar power, no single array configuration will accommodate every application. Therefore, different shapes of the PV modules represented by the PV modules 100, 200 may be coupled together to form arrays or devices in a variety of other, larger shapes and sizes. FIG. 5 illustrates an example of the triangular PV module 100 coupled to two square PV modules 200. It will be appreciated that other combinations will form other shapes, allowing PV arrays or devices to be made to accommodate many different applications. The connection paths for the connectors of FIGS. 6-10 are also visible. As can be seen, the positive and negative connectors for each side are suitable for connection to one another. FIGS. 6-10 also show that a cell converter 608, 708 may be coupled to these connectors and the internal lines of the PV modules.

When a number of PV modules of embodiments are coupled together in a one-dimensional or two-dimensional array, they may not all have the same orientation relative to the sun or, because of differences in size, may not all receive the same amount of light. In some circumstances, some may even be in shade while others receive sunlight. Thus, different solar cells in the array may have different voltages and currents at their respective output connectors and one or more cells may operate away from maximum power. A power converter (cell converter) may be embedded in the individual PV module according to embodiments. The cell converter may be, for example, a DC-DC boost converter to raise the relatively low voltage output from a solar cell, such as 0.6 V, to a more useful voltage, such as 1.1 V for logic circuitry, 3.3 V for analog or logic circuitry, 5.0 V for USB compatibility, or other voltages as required. Other types of converters and inverters may also be used.

Each cell converter preferably incorporates a maximum power point tracking (MPPT) function enabling each cell converter to provide the maximum possible power at the output connectors. Under conditions in which the load is unable to absorb all of the available power, the cell converter may sense the over-voltage and reduce the power output to match the load. Also, power may be curtailed until the voltage drops to a compatible level or the converter may use a control loop to reduce power to a level required to maintain a desired voltage.

Figure 6:
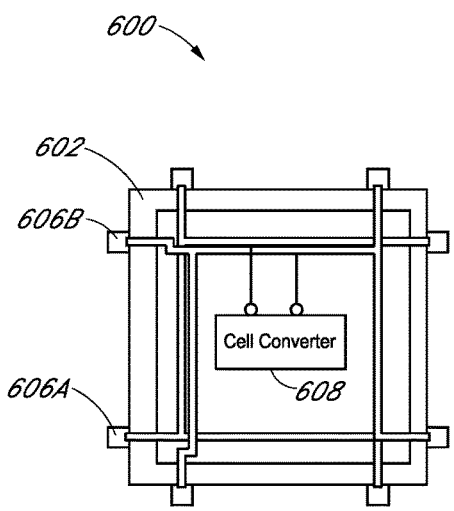
FIG. 6 illustrates an example of an internal electrical configuration of a PV module, according to some embodiments.
Figure 7:
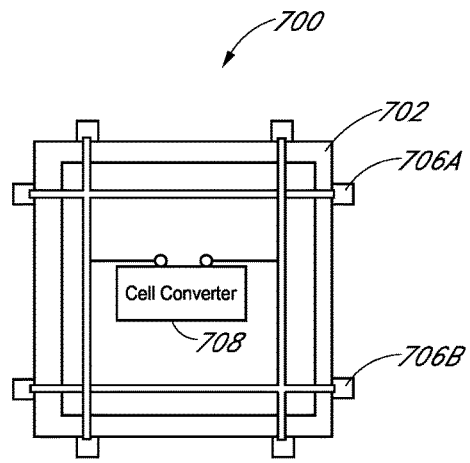
FIG. 7 illustrates another example of an internal electrical configuration of a PV module, according to some embodiments.

FIGS. 6 and 7 illustrate different internal configurations by which a cell converter 608, 708 may be electrically coupled to the positive and negative connectors. FIG. 6 illustrates the PV module 600 in which the positive and negative connectors 606A, 606B are positioned alternately around the perimeter of the frame 602 and electrically coupled to the cell converter 608. FIG. 7 illustrates the PV module 700 in which the positive and negative connectors 706A, 706B on one side of the frame 702 are reflected by the positive and negative connectors 706A, 706B on the opposite side and electrically coupled to the cell converter 708.

Figure 8:
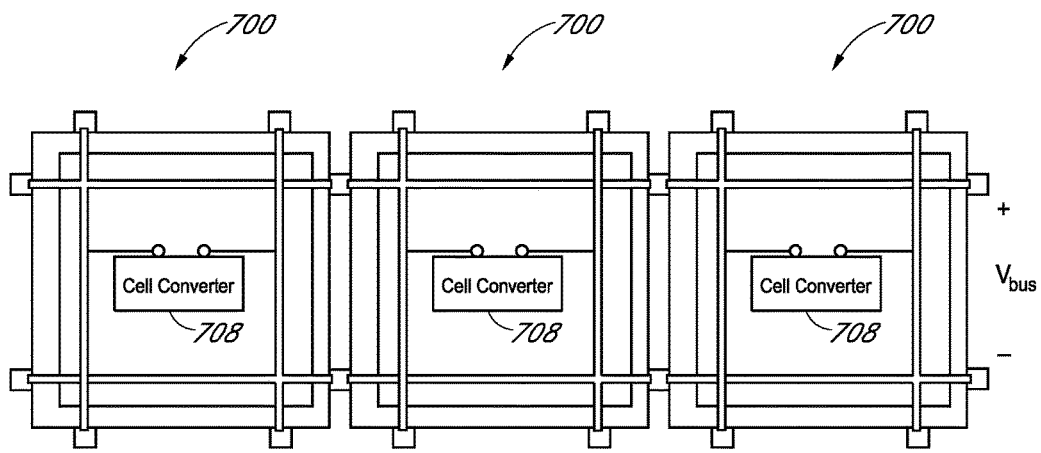
FIG. 8 illustrates an example of three PV modules of FIG. 7 electrically coupled in parallel, according to some embodiments.

The selection of the configuration of positive and negative connectors, FIG. 6 or FIG. 7, is preferably selected using the particular application for which the PV system is to be used. Likewise, the voltage at the cumulative output of the PV modules of the array is generally based on other components to which the array of modules is coupled. For example, FIG. 8 illustrates an example of three PV modules 700 of FIG. 7 electrically coupled in parallel configured to increase the power output to a voltage bus $V_{bus}$, according to some embodiments.

Figure 9:
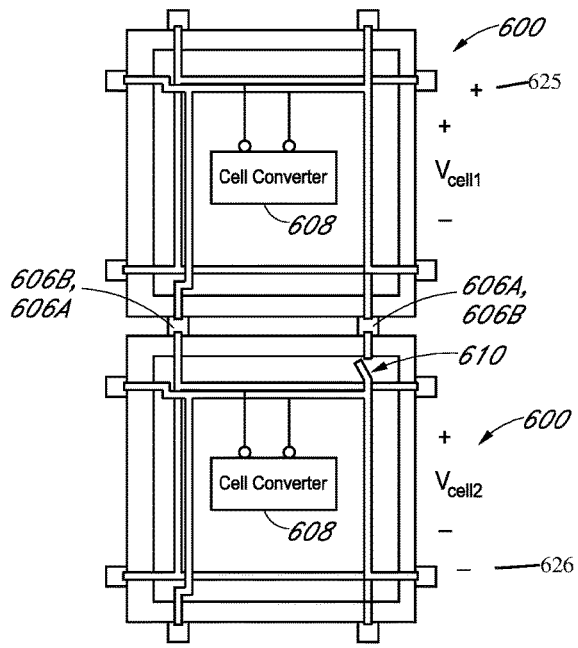
FIG. 9 illustrates two PV modules of FIG. 6 electrically coupled in series, according to some embodiments.

FIG. 9 illustrates an example of two PV modules 600 of FIG. 6 electrically coupled in series configured to increase the voltage output, being the sum of the voltages, i.e., 625,626, of the individual PV modules 600, to the voltage bus $V_{bus}$, according to some embodiments. Any or all of the cell converters and/or internal lines of embodiments may include an internal disconnect 610, such as a switch, fuse, or the like, to deactivate one or more of the cell converter's positive external voltage connections, negative external voltage connections, or both, thus enabling the PV modules to be connected in series, as shown. Also, to prevent physical, and therefore electrical, contact with external connectors of other PV systems, one or more of the external voltage connectors of embodiments may be configured to be removed, such as by tearing or cutting, from the frame. One or more of the external voltage connectors may also be capped or otherwise covered.

In embodiments, the positive and negative connectors may be notched, keyed, indexed, or otherwise prevented from being electrically incorrectly coupled with each other. For example, the connectors of PV module 700 illustrated in FIG. 7 may be indexed such that the positive connectors will mate with positive connectors and negative connectors will mate with negative connectors to allow the PV module 700 to be coupled in parallel (FIG. 8). And, the connectors of PV module 600 illustrated in FIG. 6 may be indexed such that the positive connectors will mate with negative connectors to allow the PV module 600 to be coupled in series (FIG. 9).

Figure 10:
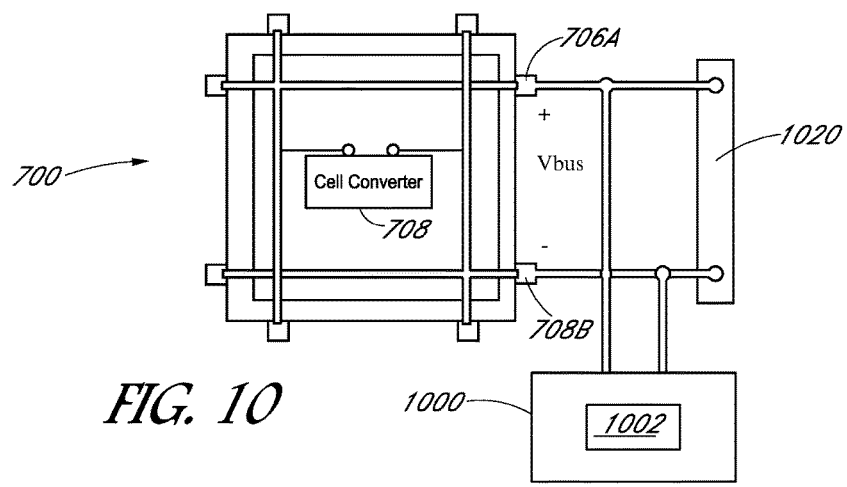
FIG. 10 illustrates the PV modules of FIG. 2 electrically coupled to a battery block, according to some embodiments.

Embodiments may also include a storage cell 1000 electrically coupled to one of the pairs of externally accessible connectors of a PV module 700, as illustrated in FIG. 10. The storage cell 1000 may be a battery or a capacitor and may include power converter 1002. To allow for charging the storage cell 1000 from the PV module 700 and discharging the storage cell 1000 to a connected load when there is insufficient power from the PV module 700, the power converter 1002 or other converters in embodiments may be bi-directional. For example, a synchronous buck converter may be used to step down the voltage from the bus $V_{bus}$ to the storage cell 1000 and step up the voltage from the storage cell 1000 to the bus. The power converter 1002 monitors the bus voltage and increases or decreases the current to the storage cell 1000 to maintain the bus voltage. An example of such a bi-directional converter 1002 is described in U.S. Pat. No. 8,350,411, entitled Modular System for Unattended Energy Generation and Storage, assigned to the assignee hereof and incorporated by reference in its entirety.

The energy storage capability of the storage cell 1000 and its voltage and current characteristics, among other characteristics, may be selected to accommodate desired applications. The storage cell 1000 may be only electrically coupled to the PV module 700, such as with wire. Alternatively, the storage cell 1000 may also be physically secured to the PV module 700, such as with the hooks 210A, 210B illustrated in FIG. 3.

Figure 11:
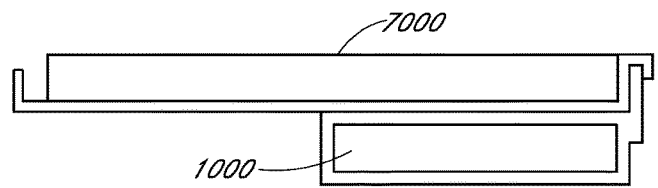
FIG. 11 illustrates the battery block of FIG. 10 secured to the bottom of a PV module, according to some embodiments.

FIG. 11 depicts the storage cell 1000 secured below the PV module 700, forming a compact unit. Although in some embodiments, every PV module 700 may be electrically (and possibly mechanically) coupled to a storage cell 1000, in other embodiments, there may be fewer storage cells 1000 than PV modules 700, all based upon the desired application. In still other embodiments, the load connected to the array itself may serve as an energy storage unit, such as a mobile phone with its own internal battery. Rather than include MPPT capability, the power converter 1002 may regulate the output voltage to accommodate the battery in the load.

When a number of storage cells 1000 are incorporated into an array, one or more storage cells 1000 may discharge before the others, reducing its cycle life. A controller that allows power to be shared among the storage cells 1000 and allows them to discharge equally is the subject of U.S. Pat. No. 7,663,342, entitled Apparatus, System, and Method for Controlling Multiple Power Supplies, assigned to the assignee hereof and incorporated by reference in its entirety. Such a controller may comprise the controller 1002.

In some instances, the bus voltage from the array is incompatible with the load requirement. A post-regulator, such as any of various designs of linear and switching regulators, may be used to provide one or more additional voltage outputs.

After PV systems and storage cells are assembled into a desired configuration, the resulting array or device may be electrically coupled to the load with any appropriate output connector 1020 (FIG. 10) and cable. One end of the cable connects to the array and the connector 1020 on the other end is connectable to the load, either permanently or removably, such as when a USB connector is used.

In some embodiments, the surface of a PV module may have a color and the surfaces of different PV systems in an array may have different colors, allowing various aesthetic patterns and effects to be created. The surface of the PV system may also be etched with designs or text.

Figure 12:
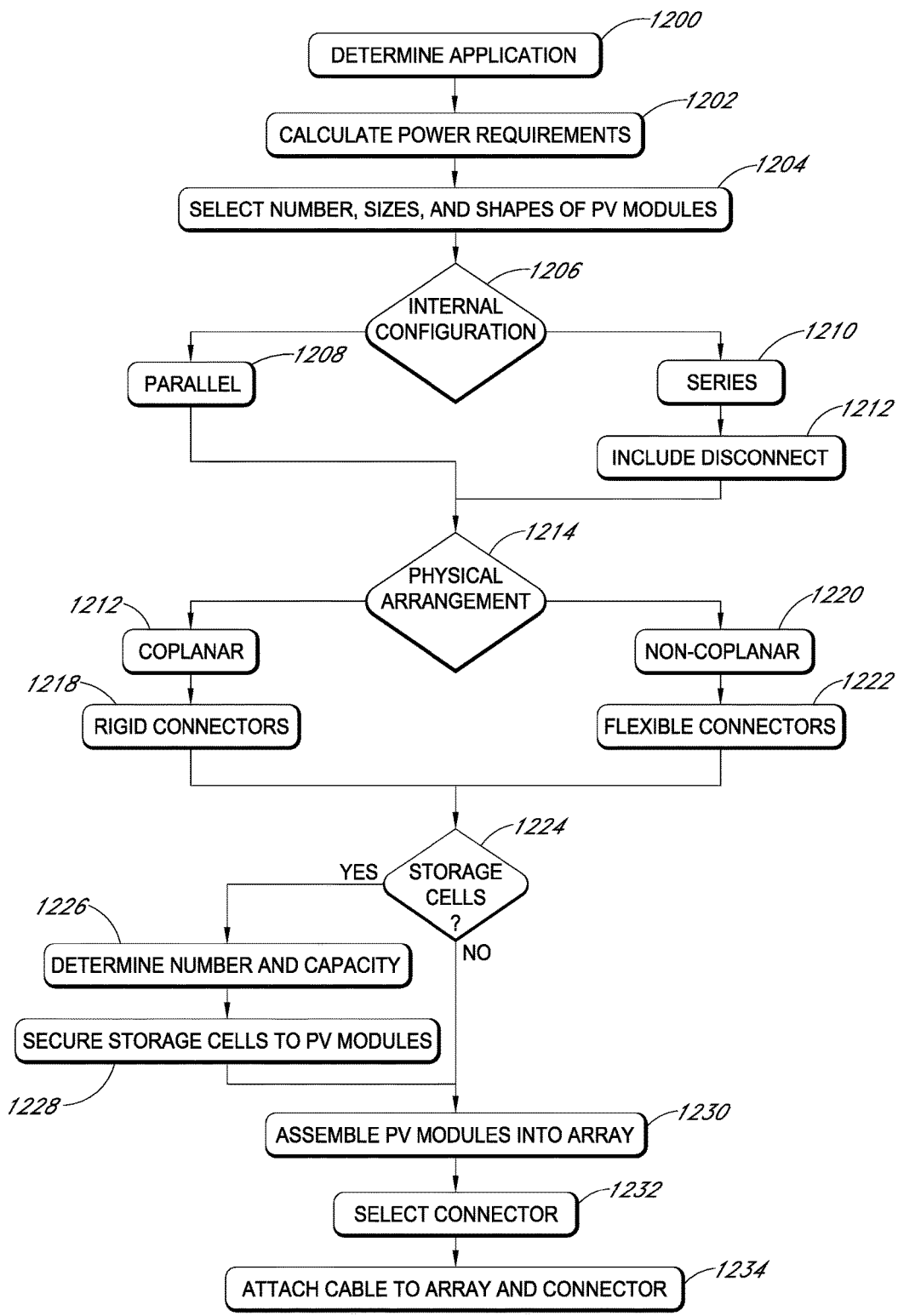
FIG. 12 illustrates a flowchart of an assembly process, according to some embodiments.

PV modules (referring generally to the PV modules according to embodiments regardless of shape or internal electrical configuration) may be fabricated in a number of sizes and shapes and sold to developers to be assembled and incorporated into specific products for end users. Turning now to the flowchart of FIG. 12, an exemplary process will be described for the assembly of PV modules into an array or device by a developer (or by the manufacturer). For each application for which the developer wishes to provide a PV array (step 1200), the developer will preferably calculate the power requirements for the item to which the array will be coupled (step 1202) and the number, sizes, and shapes of the PV modules 100 to generate the desired power output (step 1204). The internal electrical configuration of each PV module may also be determined (step 1206). Some or all of the PV modules may be coupled in parallel (step 1208) while some or all may be coupled in series (step 1210). If some are to be coupled in series, an internal disconnect may be provided (step 1212), such as the disconnect 610 illustrated in FIG. 9 and described above. The developer may also determine the physical arrangement of the PV module 100 (step 1214). If part or all of the array or device will be coplanar (step 1216), the PV module may preferably have rigid connectors (step 1218), such as the connector 210A, 210B illustrated in FIG. 3 and described above. If part or all of the array or device may be non-coplanar (step 1220), the PV modules may preferably have flexible connectors (step 1222), such as the connector 214 illustrated in FIG. 4 and described above.

If the electrical item to which the array is to be electrically coupled includes an internal battery (step 1224), such as a cell phone or tablet computer, it is not necessary that the PV module the developer selects include storage cells 1000. If, however, the array is intended to provide power to an electrical item without an internal battery, at least some of the PV modules will include a storage cell 1000 and the developer determines the number and capacity of the storage cells 1000 (step 1226). The developer may then secure the storage cells 1000 to the PV modules, as illustrated in FIG. 11, or electrically couple them together if a mechanical connection is not necessary (step 1228). The resulting units of PV modules and storage cells 1000 are then assembled into the array (step 1230). Finally, the developer selects a connector 1020 that is compatible with the electrical item to be powered or charged (step 1232) and attaches a cable between the positive and negative connectors of the array and the connector 1020 (step 1234).

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A modular photovoltaic system comprising:
   a photovoltaic (PV) cell;
   a first frame coupled to the PV cell, the first frame configured to support a plurality of pairs of externally accessible connectors, each pair of the plurality having a positive voltage connector and a negative voltage connector, the positive voltage connector of each pair of the plurality electrically connected to each other and the negative voltage connector of each pair of the plurality electrically connected to each other, each pair of the plurality of pairs of externally accessible connectors extending outwardly from the first frame; and
   a converter configured to receive voltage from the PV cell and change the voltage for output at one or more pairs of the externally accessible connectors.

2. The modular photovoltaic system of claim 1 wherein the PV cell consists of a triangular shape and the first frame consists of three connected sides.

3. The modular photovoltaic system of claim 1 further comprising a second frame, the second frame coupled to a second PV cell, the second frame configured to support a plurality of pairs of externally accessible connectors, each pair of the plurality of pairs of externally accessible connectors having a positive voltage connector and a negative voltage connector, the positive voltage connector of each pair of the plurality of pairs of externally accessible connectors electrically connected to each other and the negative voltage connector of each pair of the plurality of pairs of externally accessible connectors electrically connected to each other, each pair of the plurality of pairs of externally accessible connectors extending outwardly from the second frame, wherein when a pair of externally accessible connectors from the first frame and from the second frame are connected the first frame and the second frame are spaced apart from each other.

4. The modular photovoltaic system of claim 1 wherein the pairs of externally accessible connectors are biased to promote connection orientation to pairs of externally accessible connectors supported by a second frame.

5. The modular photovoltaic system of claim 1 further comprising:
   a storage cell, the storage cell positioned outside of the first frame; and
   a storage cell converter, the storage cell converter configured to increase or decrease voltage to or from the storage cell.

6. The modular photovoltaic system of claim 5 wherein the storage cell is a battery or a capacitor.

7. The modular photovoltaic system of claim 1 wherein the converter is configured with Maximum Power Point Tracking services to manage power output of the PV cell,
   wherein the PV has an outer periphery,
   wherein the frame surrounds the outer periphery of the PV cell,
   wherein at least one pair of externally accessible connectors is configured with tear-away bias, and
   wherein a switch is positioned to disconnect a positive voltage connector or a negative voltage connector from a pair of externally accessible connectors.

8. A modular solar cell device comprising:
   a first multi-side frame configured to mate with a second multi-side frame, the first multi-side frame surrounding at least one photovoltaic (PV) cell,
   the first multi-side frame supporting a plurality of pairs of external connectors,
      wherein the pairs of external connectors have positive and negative connectors with the positive connectors positioned around the first multi-side frame and electrically connected to each other via a first circuit and the negative connectors positioned around the first multi-side frame and electrically coupled connected to each other via a second circuit, the first circuit separate from the second circuit,
      an internal switch electrically coupled to at least the positive connectors or the negative connectors such that when the switch is closed the at least one PV cell is connected in parallel to a second PV cell outside of the first multi-side frame and when the switch is open the at least one PV cell is connected in series to a second PV cell outside of the first multi-side frame.

9. The modular solar cell device of claim 8 wherein the first multi-side frame is further configured to mate with the second multi-side frame along a shared plane of reference and both the first multi-side frame and the second multi-side frame are in the shape of a polygon.

10. The modular solar cell device of claim 8 wherein the first multi-side frame is further configured to mate with the second multi-side frame while not being on the same plane of reference as the second multi-side frame and both the first multi-side frame and the second multi-side frame are in the shape of a triangle or quadrilateral or other polygon.

11. The modular solar cell device of claim 8 wherein the second multi-side frame supports and surrounds at least one photovoltaic (PV) cell.

12. The modular solar cell device of claim 8 wherein the converter is configured with Maximum Power Point Tracking services to manage power output of at least one PV cell.

13. The modular solar cell device of claim 8 wherein the first multi-side frame is further coupled to a battery, the battery configured to receive and store voltage from at least one PV cell.

14. The modular solar cell device of claim 8 wherein the external connectors electrically are coupled to a converter, the converter electrically coupled to the at least one PV cell, and
   wherein the converter is configured with over-voltage management, the over-voltage management tailored to sense over-voltage conditions and curtail power in response.

15. The modular solar device of claim 8 wherein at least some of the external connectors are notched, the notch providing a failure location for removing the external connector from connection to the multi-side frame the connector is supported by.

16. The modular solar device of claim 8 wherein a first switch is positioned and configured to electrically connect or electrically disconnect one or more positive voltage external connectors,
or
a second switch is positioned and configured to electrically connect or electrically disconnect one or more negative voltage external connectors,
or both.

17. A modular solar cell device comprising:
a first multi-side frame configured to mate with a second multi-side frame, the first multi-side frame surrounding at least one photovoltaic (PV) cell,
the first multi-side frame supporting a plurality of pairs of external connectors,
wherein the pairs of external connectors have positive and negative connectors with the positive connectors positioned around the first multi-side frame and electrically connected to each other and the negative connectors positioned around the first multi-side frame and electrically connected to each other, and
wherein the first multi-side frame is further configured to mate with the second multi-side frame while not being on the same plane of reference as the second multi-side frame.

18. The modular solar cell device of claim 17 wherein the second multi-side frame surrounds at least one photovoltaic (PV) cell and wherein an output voltage of the first multi-side frame is different than an output voltage of the second multi-side frame.

19. The modular solar cell device of claim 17 wherein the second multi-side frame surrounds at least one photovoltaic (PV) cell and wherein an output voltage of the first multi-side frame is twice or half an output voltage of the second multi-side frame.

* * * * *